US011336263B2

(12) United States Patent
Stander et al.

(10) Patent No.: US 11,336,263 B2
(45) Date of Patent: May 17, 2022

(54) NEGATIVE-RESISTANCE CIRCUIT AND ACTIVE FILTER FOR MILLIMETRE WAVE FREQUENCIES

(71) Applicant: UNIVERSITY OF PRETORIA, Pretoria (ZA)

(72) Inventors: Tinus Stander, Pretoria (ZA); Nishant Singh, Pretoria (ZA)

(73) Assignee: University of Pretoria, Pretoria (ZA)

( * ) Notice: Subject to any disclaimer, the term of this patent is extended or adjusted under 35 U.S.C. 154(b) by 0 days.

(21) Appl. No.: 16/771,773

(22) PCT Filed: Dec. 13, 2018

(86) PCT No.: PCT/IB2018/060009
§ 371 (c)(1),
(2) Date: Jun. 11, 2020

(87) PCT Pub. No.: WO2019/116299
PCT Pub. Date: Jun. 20, 2019

(65) Prior Publication Data
US 2021/0194461 A1 Jun. 24, 2021

(30) Foreign Application Priority Data
Dec. 14, 2017 (GB) ...................................... 1720870

(51) Int. Cl.
*H03H 11/04* (2006.01)
*H03H 11/10* (2006.01)
*H03H 11/00* (2006.01)

(52) U.S. Cl.
CPC ............. *H03H 11/04* (2013.01); *H03H 11/00* (2013.01); *H03H 11/10* (2013.01)

(58) Field of Classification Search
CPC . H03H 11/04; H03H 11/10; H03H 2011/0488
See application file for complete search history.

(56) References Cited

U.S. PATENT DOCUMENTS 4,816,788 A 3/1989 Ishikawa et al.
5,373,264 A 12/1994 Higgins, Jr.
(Continued)

FOREIGN PATENT DOCUMENTS

WO 98/52277 A1 11/1998
WO 00/70757 A1 11/2000

OTHER PUBLICATIONS

Ito, M. et al., "60-Ghz-Band Coplanar MMIC Active Filters", IEEE Transactions on Microwave Theory and Techniques, Mar. 1, 2004, pp. 743-750, vol. 52, No. 3, USA.
(Continued)

*Primary Examiner* — Dinh T Le
(74) *Attorney, Agent, or Firm* — Wood, Phillips, Katz, Clark & Mortimer

(57) ABSTRACT

The invention relates to a tunable, silicon-based negative-resistance circuit (10, 30) and to an active filter (50) for E-band frequencies (60 to 90 GHz). A base of a transistor (11) is connected to an on-chip inductive transmission line (13) which has a length of approximately a quarter-wavelength at a frequency of 83.5 GHz. The transmission line connects a DC voltage source (14) to the base terminal of the transistor (11) in order to bias the base. Another DC voltage source (15) is connected to the collector of the transistor (11) to bias the transistor. A capacitor (16) operatively bypasses or decouples the voltage source (15) in order to shunt high frequencies or alternating current (AC) signals to ground. The emitter terminal of the transistor (11) is connected to ground through a resistor (18) to limit the collector current ($I_e$). The circuit gives rise to improved quality factor of resonators.

12 Claims, 15 Drawing Sheets

(56) References Cited

U.S. PATENT DOCUMENTS

| | | | | |
|---|---|---|---|---|
| 5,942,950 | A * | 8/1999 | Merenda | H03B 5/1847 331/99 |
| 6,489,853 | B1 | 12/2002 | Lewis | |
| 6,603,367 | B2 * | 8/2003 | Pao | H03B 5/187 331/107 DP |
| 7,586,381 | B2 * | 9/2009 | Rohde | H03B 5/1847 331/117 R |
| 7,889,029 | B2 | 2/2011 | Tzuang et al. | |
| 8,878,631 | B2 * | 11/2014 | Tong | H03H 7/0115 333/175 |
| 8,922,305 | B2 | 12/2014 | Oran | |
| 8,957,738 | B1 | 2/2015 | Koechlin et al. | |
| 9,160,045 | B2 | 10/2015 | Hampel et al. | |
| 10,454,419 | B2 * | 10/2019 | Zhang | H03B 5/1231 |
| 2005/0059375 | A1 * | 3/2005 | Abe | H03L 7/113 455/264 |
| 2006/0044055 | A1 | 3/2006 | Ito et al. | |
| 2010/0323654 | A1 | 12/2010 | Judson et al. | |
| 2010/0330948 | A1 | 12/2010 | Judson et al. | |
| 2013/0106532 | A1 * | 5/2013 | Jin | H03H 7/075 333/168 |

OTHER PUBLICATIONS

Karacaoglu, U. et al., "Microstrip Active Filters Using GaAs FET Negative Resistance Circuits For Loss Compensation", IEICE Transactions on Electronics, Aug. 1, 1995, pp. 957-964, vol. E78-C, No. 8, Tokyo, JP.

Brucher, A. et al., "Negative resistance monolithic circuits for microwave planar active filter losses compensation", Microwave Conference, 1995. 25TH European, IEEE, Sep. 4, 1995, pp. 910-915, Piscataway, New Jersey, USA.

Singh, N. et al., "Active enhanced tunable high-Q on-chip E-band resonators in 130nm SiGe BiCMOS", 2015 IEEE International Microwave and RF Conference (IMaRC), 2015, pp. 201-204.

International Search Report, dated Mar. 29, 2019 in International Patent Application No. PCT/IB2018/060009.

* cited by examiner

30

NEGATIVE-RESISTANCE CIRCUIT AND ACTIVE FILTER FOR MILLIMETRE WAVE FREQUENCIES

FIELD OF INVENTION

This invention relates to a negative-resistance circuit for millimetre wave frequencies which includes a transistor and a transmission line. The invention also relates to an active filter which employs the negative-resistance circuit.

BACKGROUND OF INVENTION

The demand for cellular data has been growing at a high rate and the envisioned peak data rates for next generation cellular networks are in the order of 10 Giga bits per second (Gbps). The industry consensus for future cellular networks is of extreme densification and consists of a multitude of small cells as opposed to fewer large macro cells used today. This reinforces the need for small and inexpensive high-bandwidth fronthaul links between cells.

There is significant unused bandwidth available in the millimetre wave (30-300 GHz) spectrum. There lies a local minimum in atmospheric attenuation in the 80-100 GHz range which makes it suitable for medium range wireless communications. In 1979, the International Telecommunications Union (ITU) designated two channels from the E-band (60-90 GHz) for medium range point to point links with frequency ranges of 71-76 GHz and 81-86 GHz. It is the most suitable contender for high capacity fronthaul links for next generation cellular networks such as 5G. This has stimulated significant interest in research and development activity aimed at producing systems that can operate in this band.

Commercialization of the band is well underway and there are multiple high capacity transceiver solutions available on the market. The drawback of current generation hardware is the large size and high cost which is due to the technologies used. The systems available on the market typically are multi-module solutions made using waveguide components, III-V monolithic microwave integrated circuits (MMIC) and silicon integrated circuits (IC). It is apparent that current solutions are unfit for extreme densification as required by next generation cellular networks.

Previous attempts at monolithic integration have focused on III-V semiconductors as they offer better performing transistors but are limited by higher costs and lower manufacturing capacity. On the other hand, the performance of Silicon Germanium (SiGe) heterojunction bipolar transistors (HBT) has been improving significantly over the years and has now reached a point where it is suitable for millimetre wave systems. Multiple commercially available SiGe bipolar complementary metal-oxide-semiconductor (BiCMOS) processes boast transistors with transition frequencies ($f_T$) of more than 200 GHz and RF optimized stack-ups for high quality passives.

Silicon based monolithic transceivers are an ideal solution as they can be much smaller than multi-module solutions while being cost effective. The low cost of silicon based solutions is due to the economy of scale as the manufacturing capacity of silicon far exceeds any other semiconductor technology worldwide. A significant barrier to fully-integrated single-chip solutions is the high loss associated with on-chip transmission lines on the back-end-of-line (BEOL) metallization layers.

The quality factor is a metric for the selectivity of the passband response of a resonator and is defined as the ratio of energy stored to energy dissipated at resonance. When a transmission line is used as a resonator, its quality factor ($Q_0$) may be defined as:

$$Q_0 = \omega_0 \frac{\text{average energy stored}}{\text{average power loss}} = \omega_0 \frac{W_m + W_e}{P_L} \quad (1)$$

where wo is the resonance frequency, $W_m$ is the average magnetic energy stored, $W_e$ is the average electrical energy stored and $P_L$ is the average power dissipated in the transmission line. Higher ohmic losses in the resonator lead to lower ($Q_0$) values. Quality factor metrics can be classified as $Q_E$, $Q_0$ & $Q_L$ which are external Q-factor, unloaded Q-factor and loaded Q-factor, respectively. They are related to each other by:

$$\frac{1}{Q_L} = \frac{1}{Q_0} + \frac{1}{Q_E} \quad (2)$$

Quarter or half wavelength sections of transmission lines can be used to make resonators which are a basic building block of narrowband filters. However, a resonator made with lossy transmission lines exhibits low unloaded quality factors ($Q_0$). Typical single on-chip transmission-line resonators at E-band frequencies have $Q_0$ in the order of 10. This is in stark contrast to waveguide resonators in the same band which have $Q_0$ in the order of 1000. Consequently, filters made with low $Q_0$ on-chip resonators feature high insertion loss with poor selectivity.

Bandpass filters are an imperative front end component as they provide transmit and receive frequency selectivity and allow for the close spacing of multiple communications channels. This becomes increasingly relevant as more systems start transmitting at these frequencies; therefore, low loss filters are necessary for wider adoption and utilization of the E-band.

In order to build low loss bandpass filters, resonator quality factor ($Q_0$) has to be improved upon. This can be achieved by compensating for losses incurred in the transmission lines. Negative-resistance circuits have been shown to improve the quality factor ($Q_0$) of passive transmission line resonators for lower frequencies using a variety of techniques.

Much work has been done in filter synthesis, and advanced techniques exist to synthesize filters with variable quality factor resonators, variable resonant frequencies of each resonator, as well as variable complex couplings. For these techniques to be applied to on-chip bandpass filters, the resonator needs to be tuneable in both frequency and quality factor. The state-of-the-art in filters that use active Q-enhanced resonators comprise two 60 GHz filters demonstrated on a Gallium Arsenide (GaAs) MMIC with bandwidths of 2.6 and 2.1 GHz which equates to a fractional bandwidth (FBW) of approximately 3%. The GaAs BEOL process used does not offer as many metallization layers as silicon processes hence the demonstrated filter was coplanar.

The two E-band channels of 71-76 GHz and 81-86 GHz offer opportunities for medium-range high-bandwidth fixed terrestrial data-links for applications such as next generation 5G cellular fronthaul. A factor prohibiting ubiquitous deployment is a lack of monolithically integrated cheap and compact transceivers. One of the problems preventing monolithic integration is the high loss of transmission lines made using back-end-of-line metallization layers available on commercial silicon processes. Using the lossy transmission lines to make resonators and filters leads to low quality factor resonators and lossy filters with poor responses. Negative-resistance circuits have been shown to counter loss and increase resonator quality factor in GaAs MMICs at 60 GHz, but it has never been demonstrated for the E-band using commercial silicon processes.

It is an object of the invention to provide a negative-resistance circuit and active filter which at least alleviate the above drawbacks.

SUMMARY OF INVENTION

According to a first aspect of the invention, there is provided a negative-resistance circuit having an output terminal which is operatively connected or connectable to a transmission line, the negative-resistance circuit including:
- at least one transistor having three terminals;
- an inductive element which is connected to a first terminal of the transistor, the inductive element operatively serving to connect a first power source to the first terminal of the transistor in order to bias the first terminal;
- a first capacitive element which operatively bypasses a second power source, connected to a second terminal of the transistor, in order to shunt high frequencies; and
- a capacitive feedback circuit which is configured to feed a signal from a third terminal of the transistor back to the first terminal.

The inductive element may be configured to decouple the first power source from high frequencies.

The inductive element may include a distributed constant line.

The third terminal of the transistor may be connected to a ground potential through a resistive element.

The first terminal may be connected to the output terminal via a second capacitive element. The second capacitive element may decouple DC signals from the output terminal.

The capacitive feedback circuit may include a third capacitive element which connects the third terminal to the first terminal. The third capacitive element may be a Metal-Insulator-Metal capacitor.

The negative-resistance circuit may include a fourth capacitive element, one end of which is connected to the third terminal of the transistor and to the third capacitive element, the other end of which is connected to the ground potential.

The fourth capacitive element may be in parallel connection with the resistive element.

Any one of the second, third or fourth capacitive elements may be a variable capacitive element. The variable capacitive element may include a varactor. The varactor may be voltage controlled.

The transistor may be a heterojunction bipolar transistor. The first terminal may correspond to the base. The second terminal may correspond to the collector and the third terminal may correspond to the emitter of the transistor.

The output terminal may be connected to a transmission line resonator.

The invention extends to an active filter which includes:
- a negative-resistance circuit as described above; and
- a resonator connected in series with the negative-resistance circuit.

The active filter may include a plurality of coupled resonators, each resonator being connected in series with a negative-resistance circuit to form a silicon-based microstrip bandpass filter configured for use in the millimetre wave frequency band ranging between 30 GHz and 300 GHz.

The resonator may be a quarter-wave transmission line resonator.

The active filter may have a quality factor (Q) ranging between 50 and 5000. The active filter may be tunable in respect of centre frequency (fc). Furthermore, the active filter may be tunable in respect of quality factor (Q).

The invention also extends to a semiconductor device which includes:
- a complementary metal-oxide semiconductor (CMOS) die; and
- a negative-resistance circuit as described above on the die.

The invention extends to a tunable, silicon-based negative-resistance circuit configured for millimetre wave frequencies ranging between 30 GHz and 300 GHz. The invention also extends to an active filter for E-band frequencies (60 to 90 GHz).

In accordance with another aspect of the invention, there is provided an active filter which includes:
- a negative-resistance circuit having an output terminal which is operatively connected or connectable to a transmission line, the negative-resistance circuit including:
  - at least one transistor having three terminals;
  - an inductive element which is connected to a first terminal of the transistor, the inductive element operatively serving to connect a first power source to the first terminal of the transistor in order to bias the first terminal;
  - a first capacitive element which operatively bypasses a second power source, connected to a second terminal of the transistor, in order to shunt high frequencies; and
  - a capacitive feedback circuit which is configured to feed a signal from a third terminal of the transistor back to the first terminal; and
- a resonator connected to the negative-resistance circuit.

The active filter may include a plurality of coupled resonators, each resonator being connected to a negative-resistance circuit to form a silicon-based microstrip bandpass filter configured for use in the millimetre wave frequency band ranging between 30 GHz and 300 GHz.

In accordance with yet another aspect of the invention, there is provided an active filter which includes:
- a negative-resistance circuit having an output terminal which is operatively connected or connectable to a transmission line, the negative-resistance circuit including:
  - at least one transistor having three terminals;
  - an inductive element which is connected to a first terminal of the transistor, the inductive element operatively serving to connect a first power source to the first terminal of the transistor in order to bias the first terminal;
  - a first capacitive element which operatively bypasses a second power source, connected to a second terminal of the transistor, in order to shunt high frequencies; and
  - a capacitive feedback circuit which is configured to feed a signal from a third terminal of the transistor back to the first terminal; and
- a resonator connected in series with the negative-resistance circuit.

The active filter may include a plurality of coupled resonators, each resonator being connected in series with a negative-resistance circuit to form a silicon-based microstrip bandpass filter configured for use in the millimetre wave frequency band ranging between 30 GHz and 300 GHz.

The resonator may be a quarter-wave transmission line resonator. The resonator may be a quarter-wave transmission line resonator at a frequency of 83.5 GHz. A base of the transistor may be connected to an on-chip inductive transmission line which has a length of approximately a quarter-wavelength at a frequency of 83.5 GHz.

The active filter may have a quality factor (Q) ranging between 50 and 5000.

The inductive element may be configured to decouple the first power source from high frequencies. The inductive element may include a distributed constant line. The third terminal of the transistor may be connected to a ground potential through a resistive element. The first terminal may be connected to the output terminal via a second capacitive element. The capacitive feedback circuit may include a third capacitive element which connects the third terminal to the first terminal.

The active filter may include a fourth capacitive element, one end of which is connected to the third terminal of the transistor and to the third capacitive element, the other end of which is connected to the ground potential. The fourth capacitive element may be in parallel connection with the resistive element.

Any one of the second, third or fourth capacitive elements may be a variable capacitive element. The variable capacitive element may include a varactor.

The silicon-based microstrip bandpass filter may be configured for use in E-band frequencies ranging between 60 GHz and 90 GHz. The active filter may be configured for use in E-band frequencies ranging between 60 GHz and 90 GHz.

In accordance with yet another aspect of the invention, there is provided an on-wafer negative-resistance circuit configured for millimetre wave frequencies ranging between 30 GHz and 300 GHz having an output terminal which is operatively connected or connectable to a transmission line, the negative-resistance circuit including:
at least one transistor having three terminals;
an inductive element which is connected to a first terminal of the transistor, the inductive element operatively serving to connect a first power source to the first terminal of the transistor in order to bias the first terminal;
a first capacitive element which operatively bypasses a second power source, connected to a second terminal of the transistor, in order to shunt high frequencies; and
a capacitive feedback circuit which is configured to feed a signal from a third terminal of the transistor back to the first terminal.

In accordance with yet another aspect of the invention, there is provided a silicon-based negative-resistance circuit configured for millimetre wave frequencies ranging between 30 GHz and 300 GHz having an output terminal which is operatively connected or connectable to a transmission line, the negative-resistance circuit including:
at least one transistor having three terminals;
an inductive element which is connected to a first terminal of the transistor, the inductive element operatively serving to connect a first power source to the first terminal of the transistor in order to bias the first terminal;
a first capacitive element which operatively bypasses a second power source, connected to a second terminal of the transistor, in order to shunt high frequencies; and
a capacitive feedback circuit which is configured to feed a signal from a third terminal of the transistor back to the first terminal.

In accordance with a further aspect of the invention, there is provided a semiconductor device which includes:
a complementary metal-oxide semiconductor (CMOS) die; and
a negative-resistance circuit as described above on the die.

In accordance with yet another aspect of the invention, there is provided a semiconductor device which includes:
a complementary metal-oxide semiconductor (CMOS) die; and
an active filter as described above on the die.

BRIEF DESCRIPTION OF DRAWINGS

The invention will now be further described, by way of example and simulated circuitry, with reference to the accompanying diagrammatic drawings.

In the drawings.

DETAILED DESCRIPTION OF AN EXAMPLE EMBODIMENT

The following description of the invention is provided as an enabling teaching of the invention. Those skilled in the relevant art will recognise that many changes can be made to the embodiments described, while still attaining the beneficial results of the present invention. It will also be apparent that some of the desired benefits of the present invention can be attained by selecting some of the features of the present invention without utilising other features. Accordingly, those skilled in the art will recognise that modifications and adaptations to the present invention are possible and can even be desirable in certain circumstances, and are a part of the present invention. Thus, the following description is provided as illustrative of the principles of the present invention and not a limitation thereof.

In the context of this specification, the phrase "high frequency" or "high frequencies" refer to frequencies in the microwave and millimetre wave spectrum. A distributed constant line should be understood to refer to a transmission line used for guiding high frequency signals such as microwave or millimetre wave signals in microwave or millimetre wave circuits.

Figure 1:
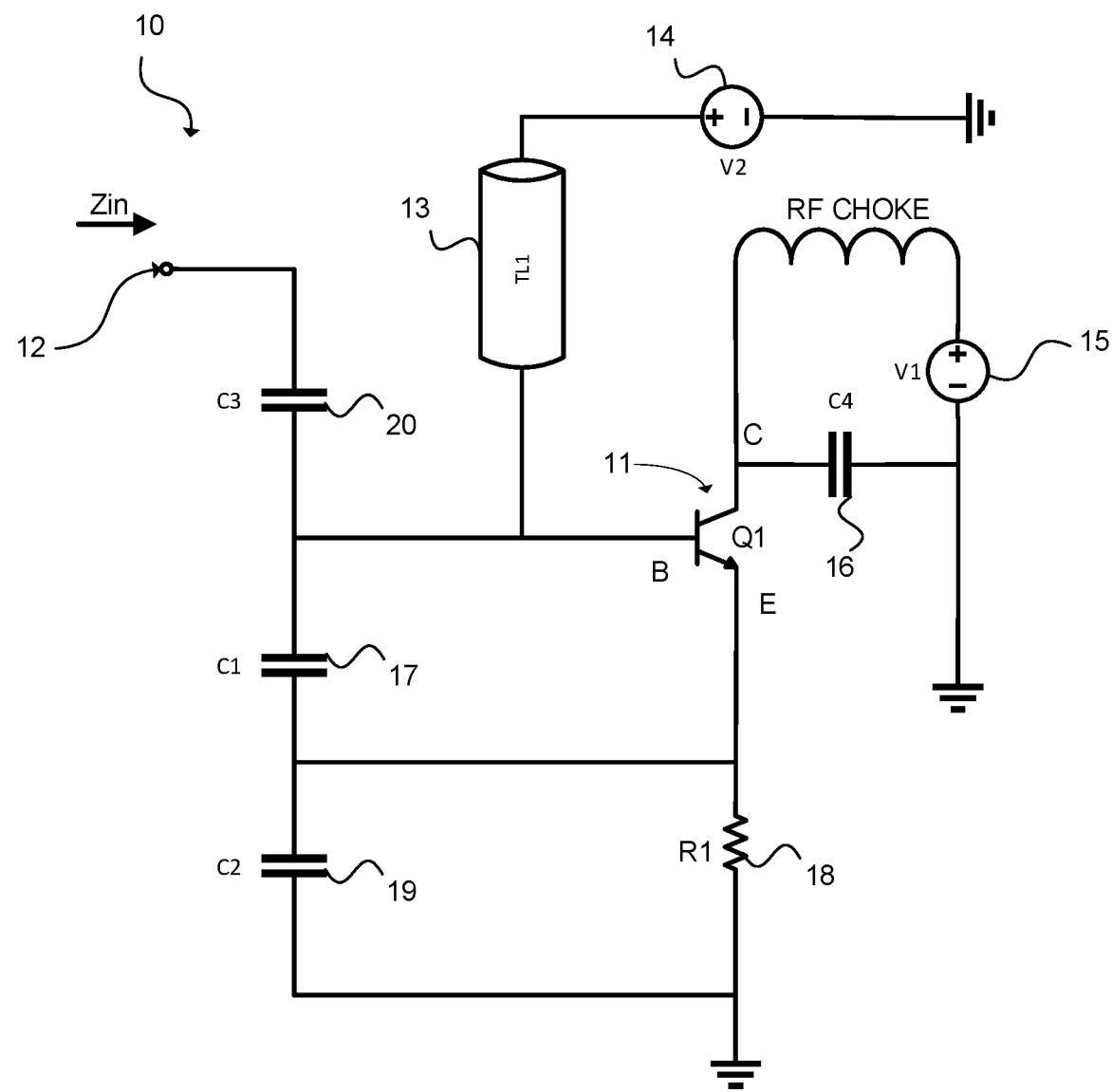
FIG. 1 shows a schematic circuit diagram of a first embodiment of a negative-resistance circuit in accordance with the invention.

In FIG. 1 reference numeral 10 refers generally to a first embodiment of a negative-resistance circuit in accordance with the invention. Although a Field-Effect Transistor (FET) may also be used to form a negative-resistance circuit, a Heterojunction Bipolar Transistor (HBT) 11 has been used in the circuit 10 illustrated in FIG. 1. The circuit 10 includes an output terminal 12 which is operatively connected to a transmission line resonator 42. As is conventional, the transistor 11 has three terminals, namely a base (designated by reference sign B), a collector (C) and an emitter (E). The base (B) of the transistor 11 is connected to an inductive element which takes the form of an on-chip inductive transmission line 13 which has a length of approximately a quarter-wavelength at a frequency of 83.5 GHz. The transmission line 13 connects a DC voltage power source 14 to the base terminal of the transistor 11 in order to bias the base (B). The inductive transmission line 13 permits DC bias of the base (B) but is configured to decouple radio frequency signals or high frequencies from the DC voltage source 14. Another power source in the form of another DC voltage source 15 is connected to the collector terminal (C) of the transistor 11 to bias the transistor 11. A capacitive element in the form of a Metal-Insulator-Metal (MIM) capacitor 16 operatively bypasses or decouples the voltage source 15 in order to shunt high frequencies or alternating current (AC) signals to ground. In doing so, the capacitor 16 connects the collector (C) to a ground potential. The RF choke indicated in the circuit 10 is used to represent cables that connect the voltage source to the circuit which are inductive in nature. The emitter terminal of the transistor 11 is connected to ground through a resistive element or resistor 18 to limit the amount of collector current ($I_c$) which follows through the transistor 11.

The negative-resistance circuit 10 further includes a capacitive feedback circuit which is configured to feed a signal from the emitter terminal (E) of the transistor 11 back to the base (B). The capacitive feedback circuit includes a MIM capacitor 17 connected between the emitter (E) and base (B). The circuit 10 includes another MIM capacitor 19 which is connected in parallel with the resistor 18. One end of the capacitor 19 is connected to the capacitor 17 of the feedback circuit, which is connected to the emitter, and the other end is connected to ground. Furthermore, the base (B) is connected to the output terminal 12 via a MIM capacitor 20 which is used to decouple DC from the transmission line resonator 42. Passive lumped element component values and dimensions for the circuit 10 are shown in the Table 1 below.

TABLE 1

Lumped element component attributes for negative-resistance circuit shown in FIG. 1

| Component | Type | Value | | Width | Length |
|---|---|---|---|---|---|
| $C_1$ | MIM capacitor | 17 | fF | 4 μm | 4 μm |
| $C_2$ | MIM capacitor | 17 | fF | 4 μm | 4 μm |
| $C_3$ | MIM capacitor | 200 | fF | 19.63 μm | 10 μm |
| $C_4$ | MIM capacitor | 463.3 | fF | 21.4 μm | 21.4 μm |
| $R_1$ | KQ BEOL resistor | 495.34 | Ω | 5.92 μm | 50 μm |

Figure 3:
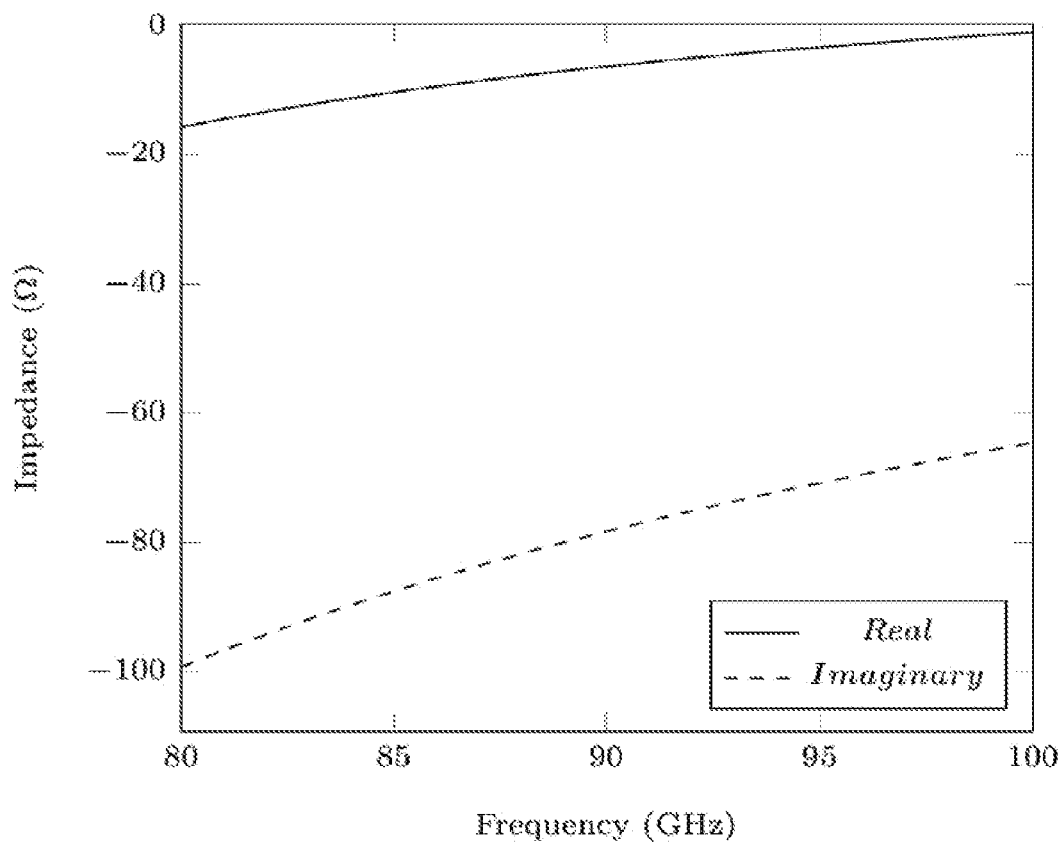
FIG. 3 shows a plot of the simulated real and imaginary input impedances of the negative-resistance circuit of FIG. 1 plotted against frequency.

The transmission line 13 is used as a RF choke to decouple the base bias voltage from the AC signal path and has a length of 500 μm, a width of 4 μm, and an inductance of 540 pH. Transistor 11 has an emitter length of 2.5 μm and an emitter width of 0.12 μm. The collector current ($I_c$) is varied by varying the voltage of voltage source 14 which in turn varies the amount of negative-resistance generated. The simulated real and imaginary input impedances (Zin) of the circuit 10 are shown in FIG. 3 for a V1 of 3.5 V and V2 of 1.31 V which results in an $I_c$ of 939.5 μA.

Figure 2:
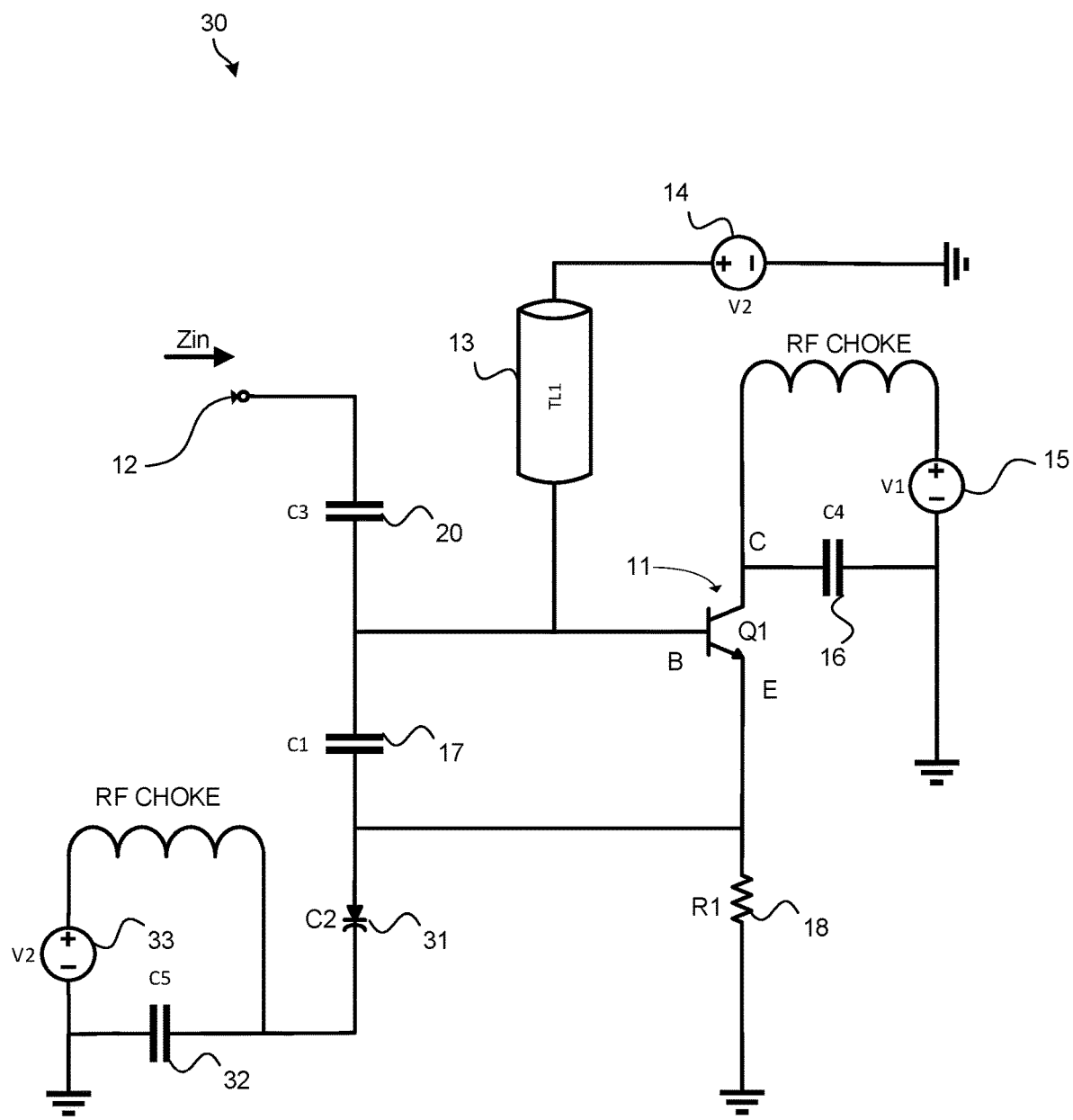
FIG. 2 shows a schematic circuit diagram of a second embodiment of the negative-resistance circuit.
Figure 4:
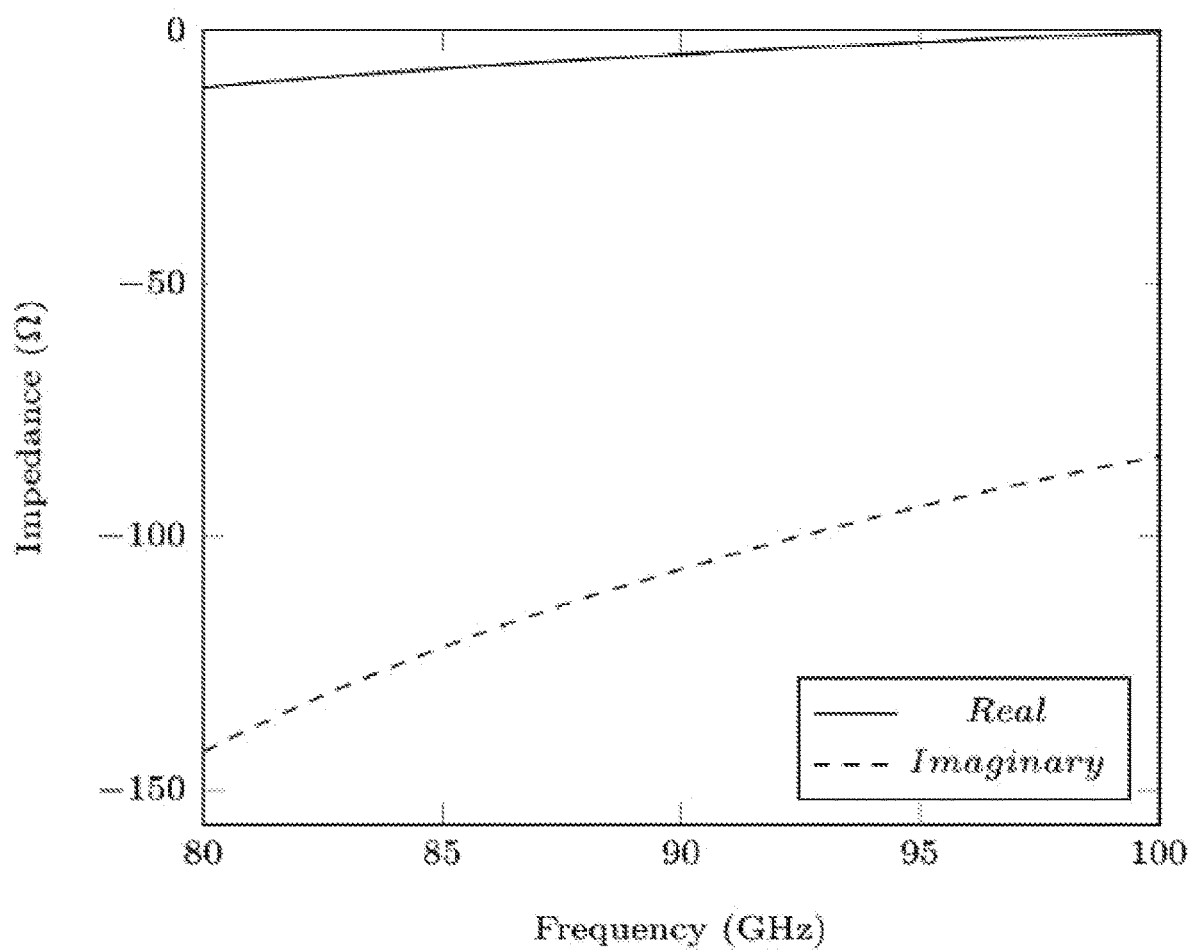
FIG. 4 shows a plot of the simulated real and imaginary input impedances of the negative-resistance circuit of FIG. 2 plotted against frequency.

A second embodiment of a negative-resistance circuit is designated by numeral 30 in FIG. 2. The same reference numerals used above have been used again to refer to similar features of the circuit 30. The circuit 30 is almost identical to the circuit 10 in FIG. 1 but with MIM capacitor 19 replaced with a hyperabrupt junction (HA) varactor 31 with a length of 3.59 μm and a width of 0.8 μm. With reference to FIG. 2, voltage source 33 (V2) is used to bias the varactor 31 and the inductive connector cables are represented by the RF choke. Another shunt capacitor 32 is used to provide a low impedance AC signal path to ground. This capacitor 32 is identical to capacitor 16 in terms of dimensions. The simulated real and imaginary input impedances (Zin) of the circuit 30 are shown in FIG. 4 for an $I_c$ of 2.422 mA and V2 of 1.5 V.

Figure 5:
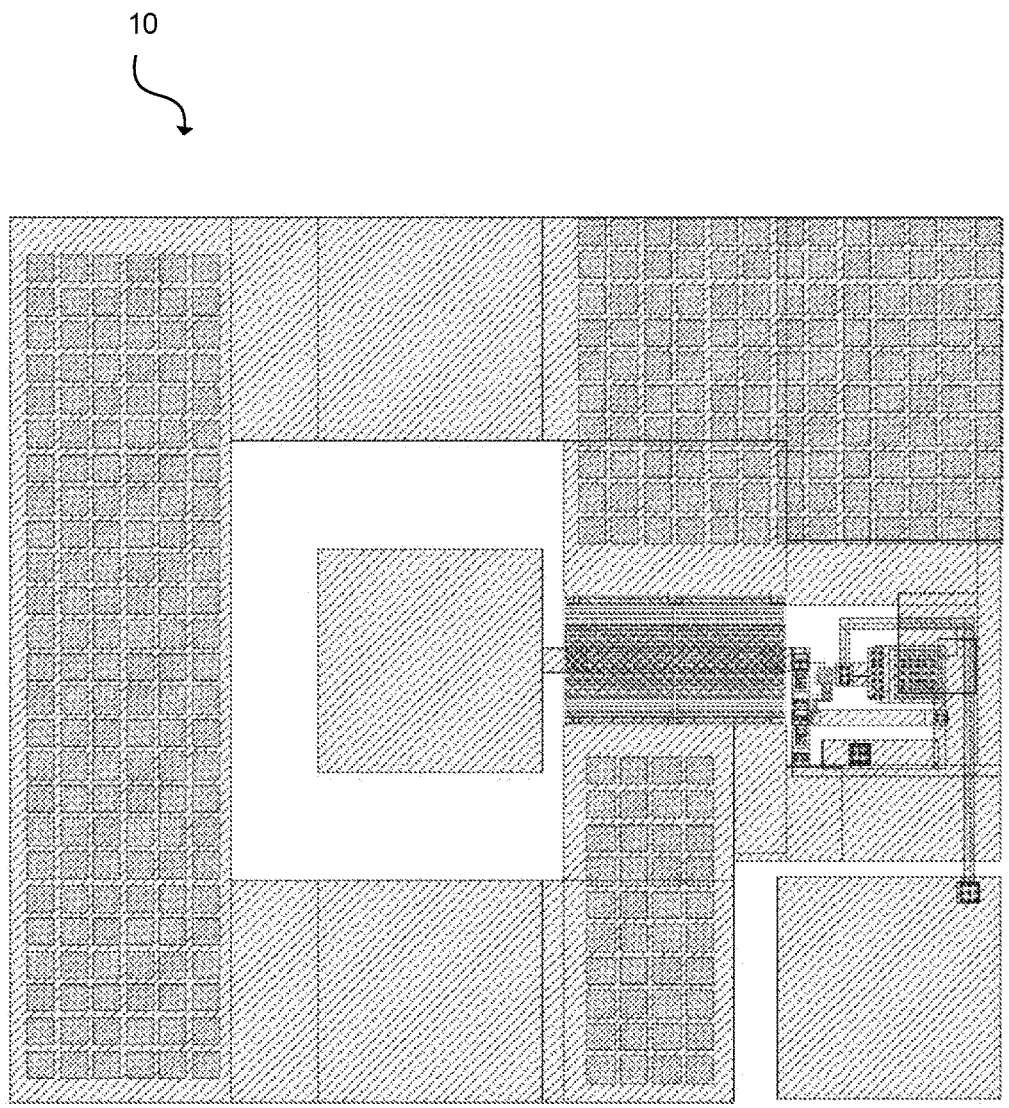
FIG. 5 illustrates a plan view of a silicon wafer layout of the negative-resistance circuit of FIG. 1.
Figure 6:
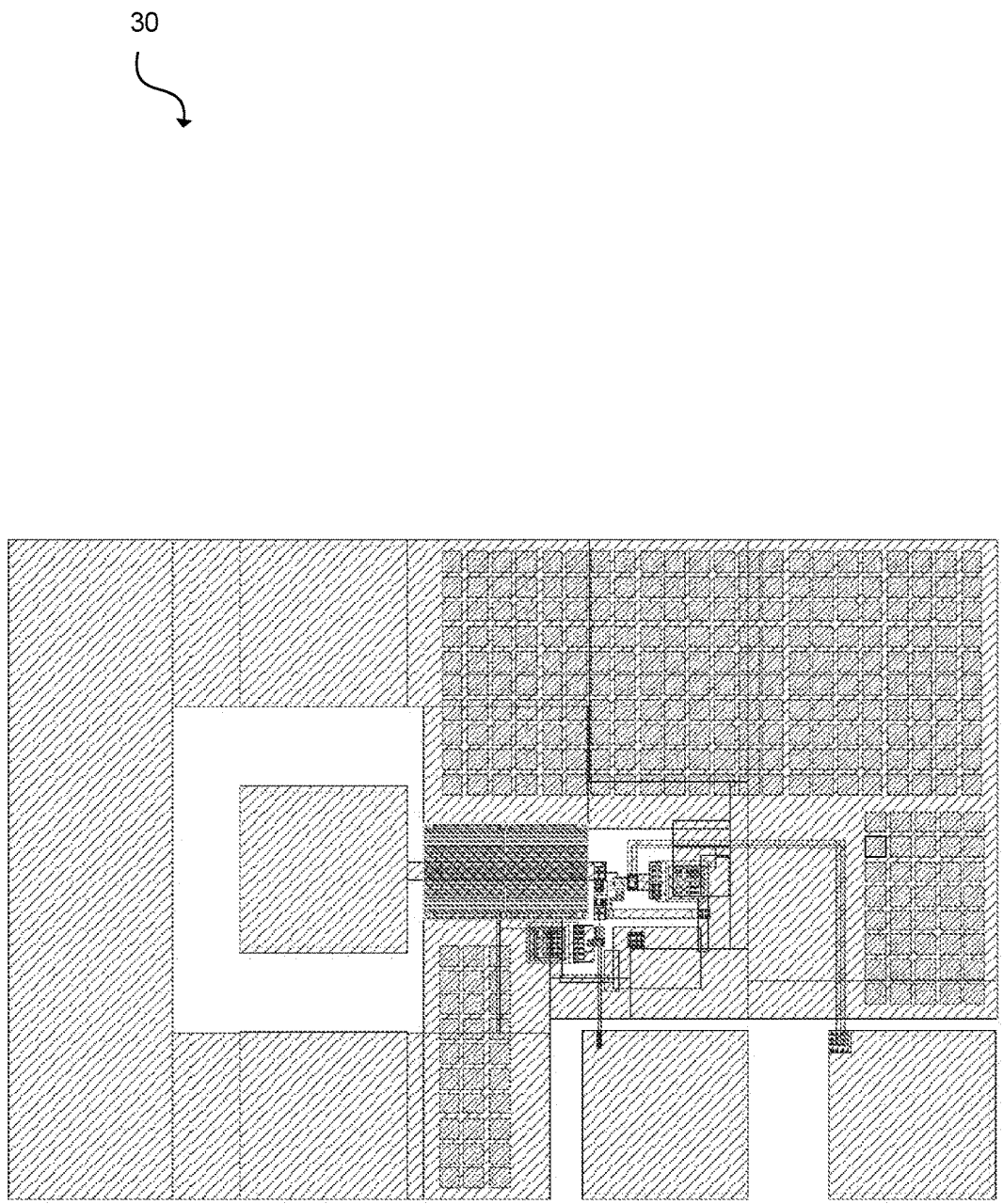
FIG. 6 illustrates a plan view of a silicon wafer layout of the negative-resistance circuit of FIG. 2.
Figure 7:
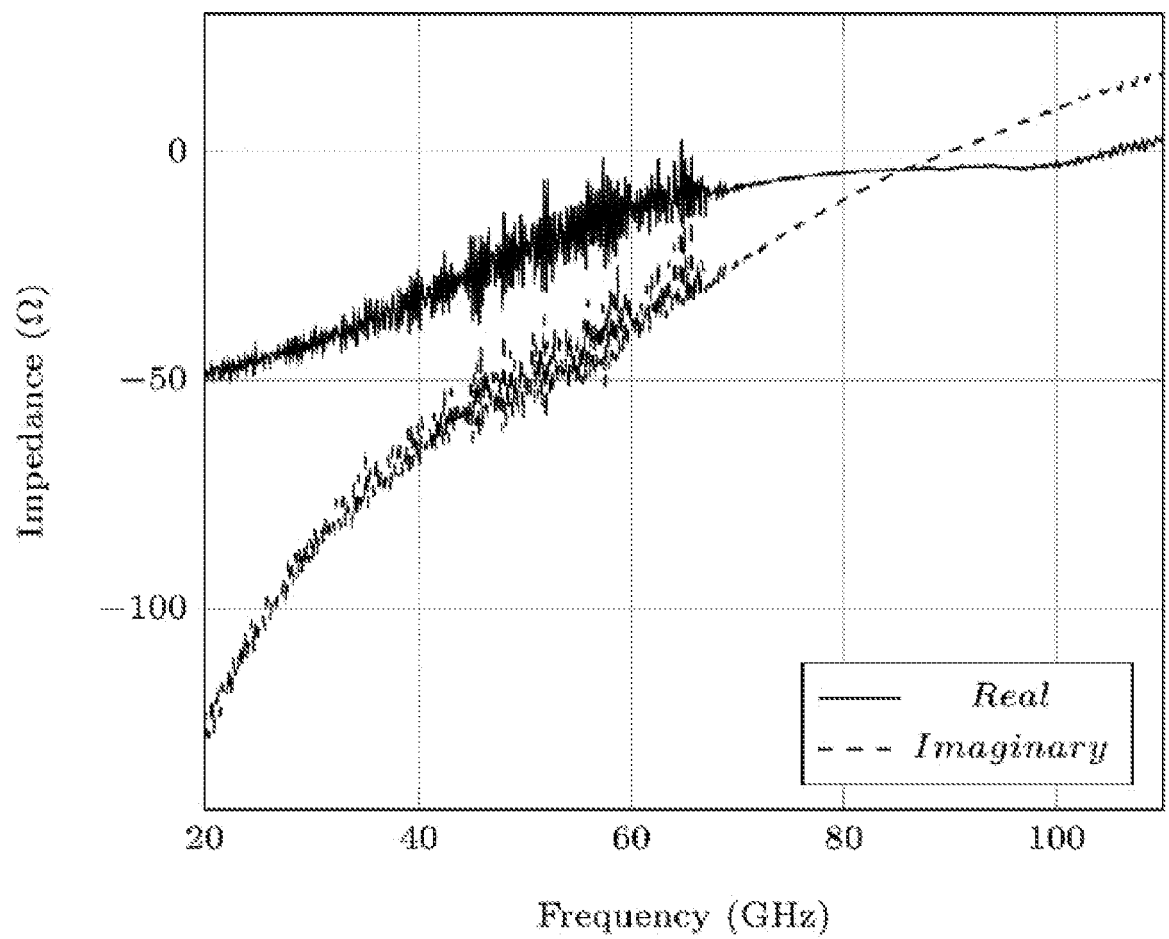
FIG. 7 illustrates a plot of the measured de-embedded real and imaginary input impedances of the negative-resistance circuit of FIG. 1 plotted against frequency.
Figure 8:
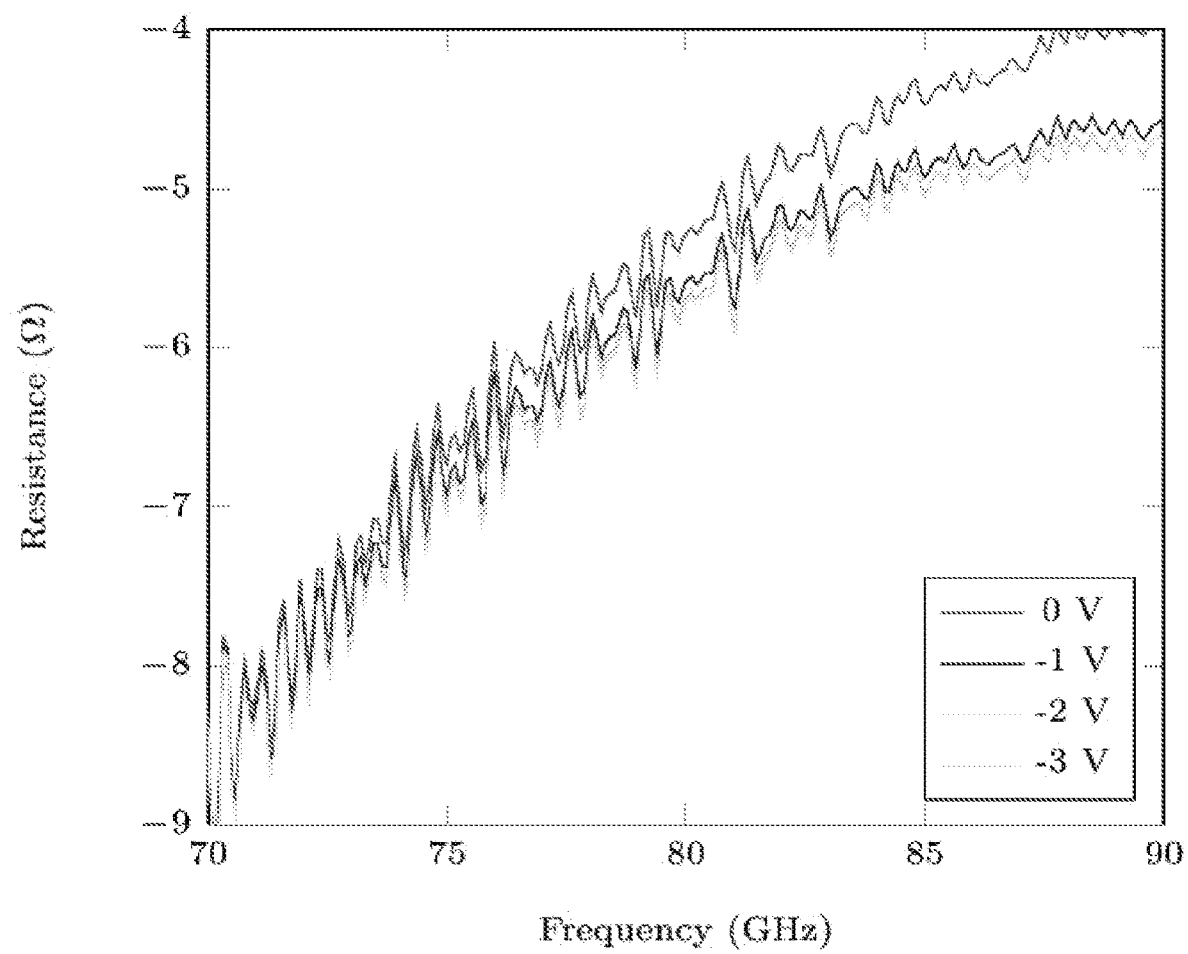
FIG. 8 illustrates a plot of negative-resistance values against frequency for different varactor voltages (V2) of the negative-resistance circuit of FIG. 2.
Figure 9:
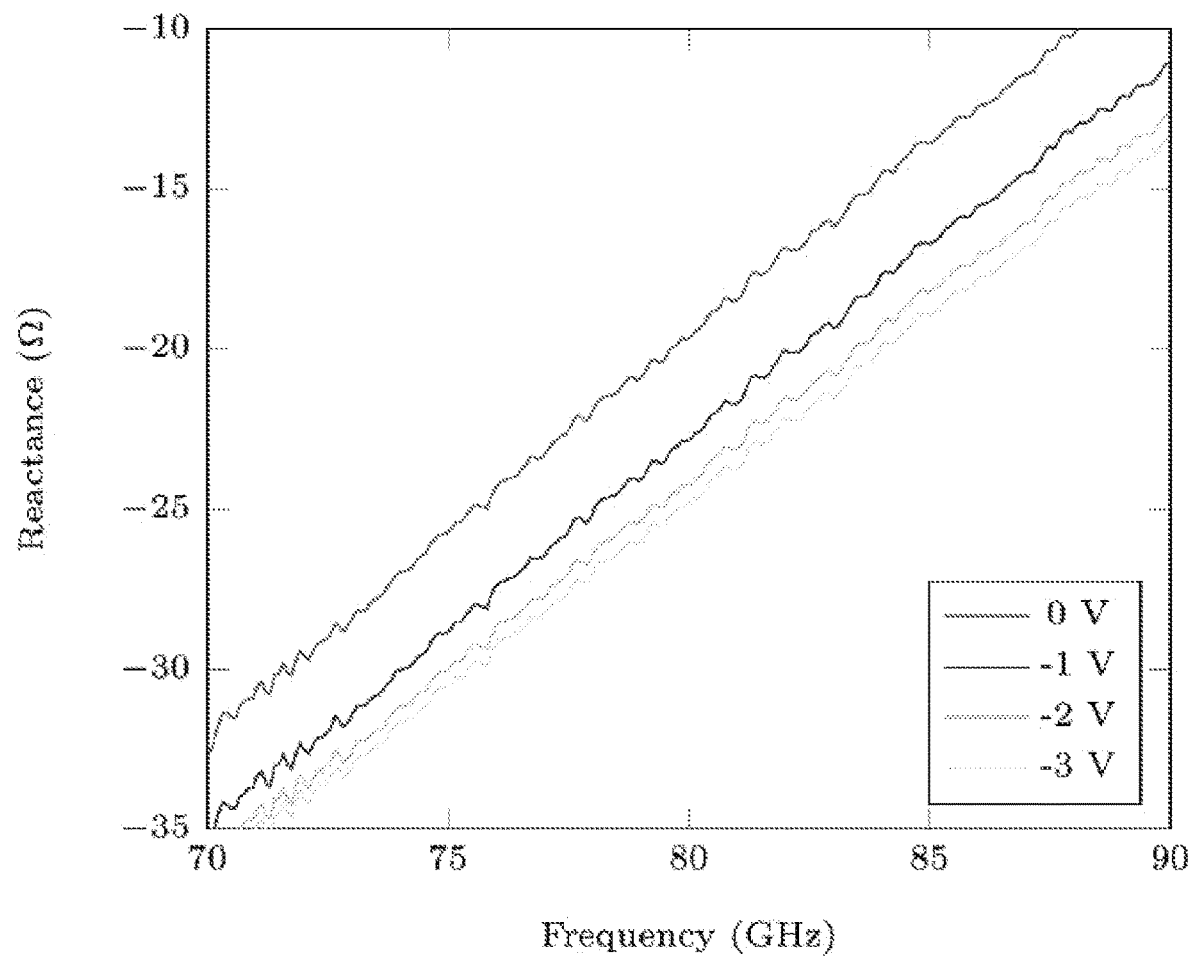
FIG. 9 illustrates a plot of reactance values against frequency for different varactor voltages (V2) of the negative-resistance circuit of FIG. 2.

On-wafer negative-resistance circuits 10, 30 shown in FIGS. 5 and 6 were developed and characterized in isolation using one-port on-wafer measurements which were de-embedded using an on-wafer open standard. The de-embedded input impedance (Zin) of the negative resistance circuit 10 which is only tunable in resistance is shown in FIG. 7 biased with a collector current of 3 mA. It can be seen that the circuit 10 offers constant negative-resistance over the E-band channels of interest. Plots of measured real and imaginary input impedance values for the negative-resistance circuit 30 are illustrated in FIGS. 8 and 9 for different varactor voltage 33 values. The transistor 11 was biased with a collector current of 3 mA. This fully-tunable negative-resistance circuit 30 enables tunable active Q-enhanced resonators.

During development of the circuitry, it was shown by simulation that a theoretical negative-resistance offers sufficient loss compensation. In addition to separate silicon-based negative-resistance circuits 10, 30 (FIGS. 5 and 6), an active transmission line resonator circuit was simulated using suitable simulation software and a silicon-based layout 40 was manufactured (see FIG. 10). In doing so the negative-resistance circuit 10 was connected to a BEOL resonator 42 with a length of 350 μm and a width of 30 μm. The BEOL resonator 42 was grounded on one side using a via array stack with two rows and nine columns. The length was chosen to be shorter than a quarter-wavelength at $f_0$ of 83.5 GHz. This is because the capacitive loading of the resonator 42 by the negative-resistance circuit 10 will increase the electrical length of the resonator 42. With reference to FIG.

10, an input transmission line 41 leads from an input port to the resonator 42 and an output transmission line 43 leads from the other side of the resonator 42 to an output port. The final filled layout of this circuit connected to the BEOL resonator structure with probe connection pads 44 included is shown in FIG. 10.

Figure 10:
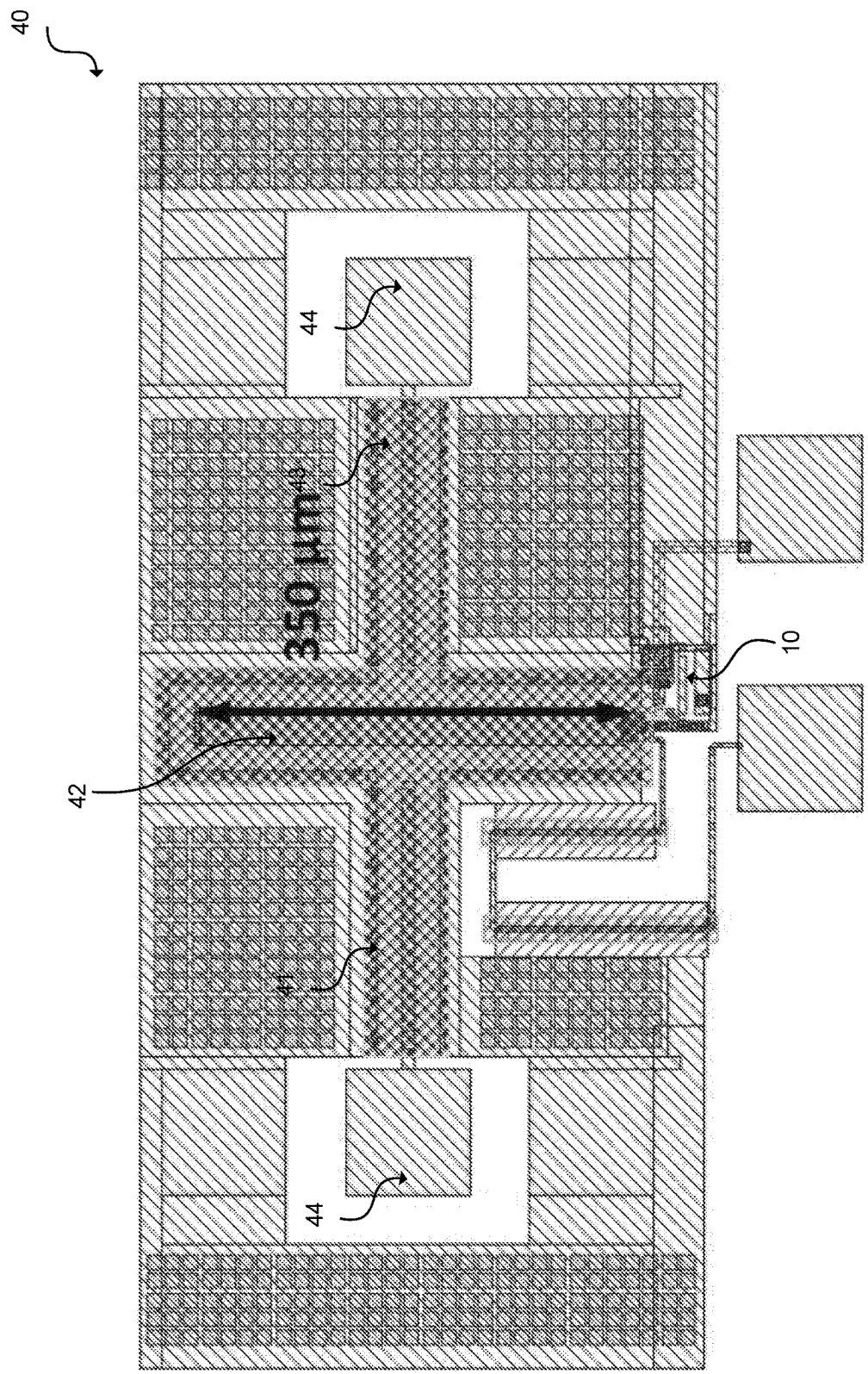
FIG. 10 illustrates a plan view of a silicon wafer layout of an active Q-enhanced resonator circuit incorporating the negative-resistance circuit of FIG. 1.
Figure 11:
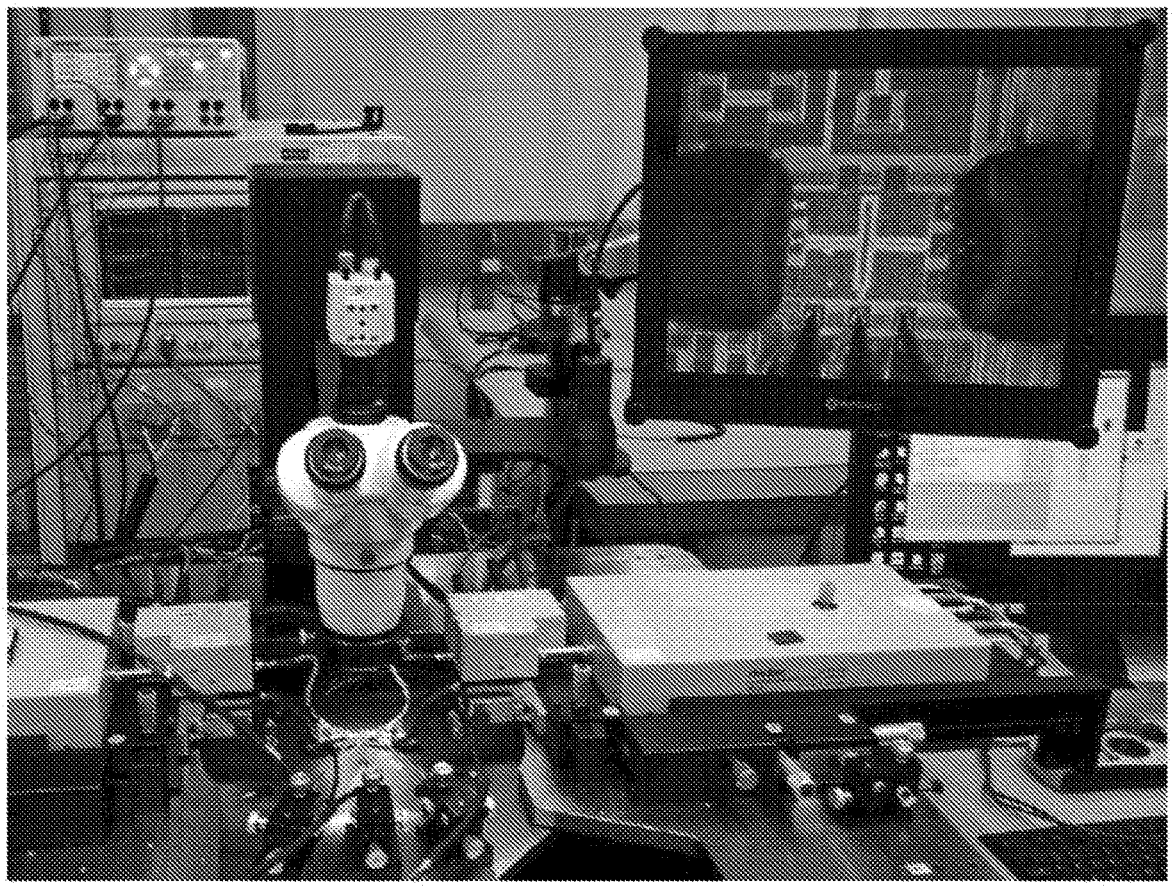
FIG. 11 is a photograph of a measurement setup used to obtain measurements of the manufactured die of FIG. 10 amongst others.
Figure 12:
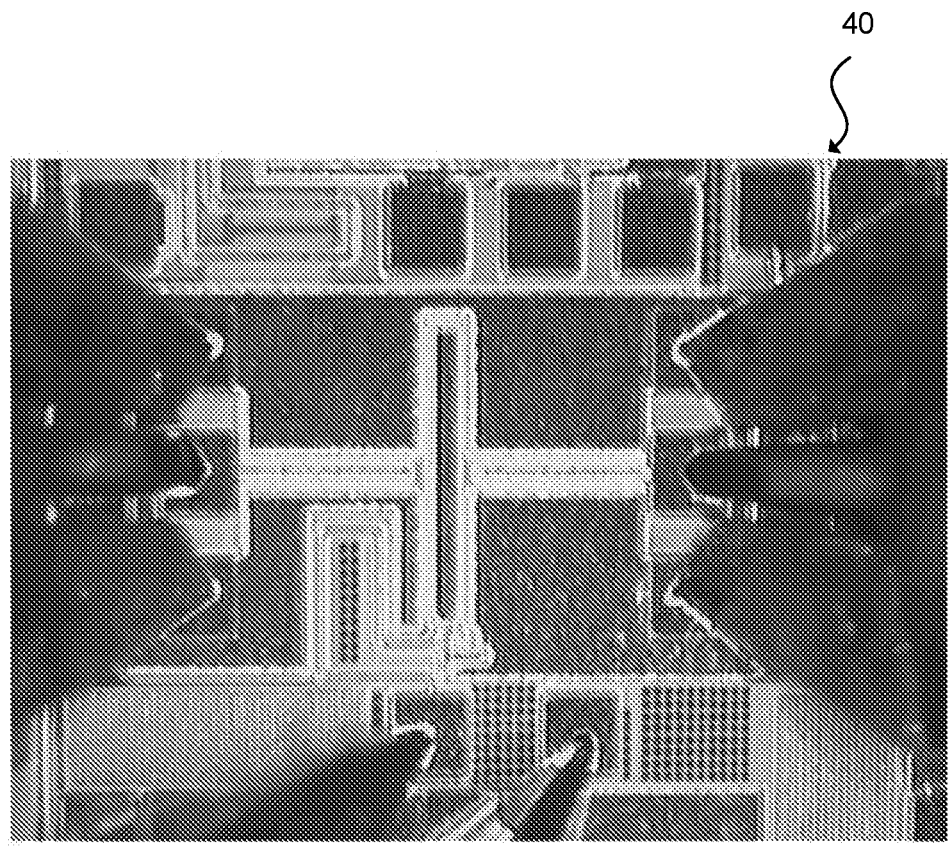
FIG. 12 shows an on-wafer measurement micrograph of the active Q-enhanced resonator of FIG. 10.
Figure 13:
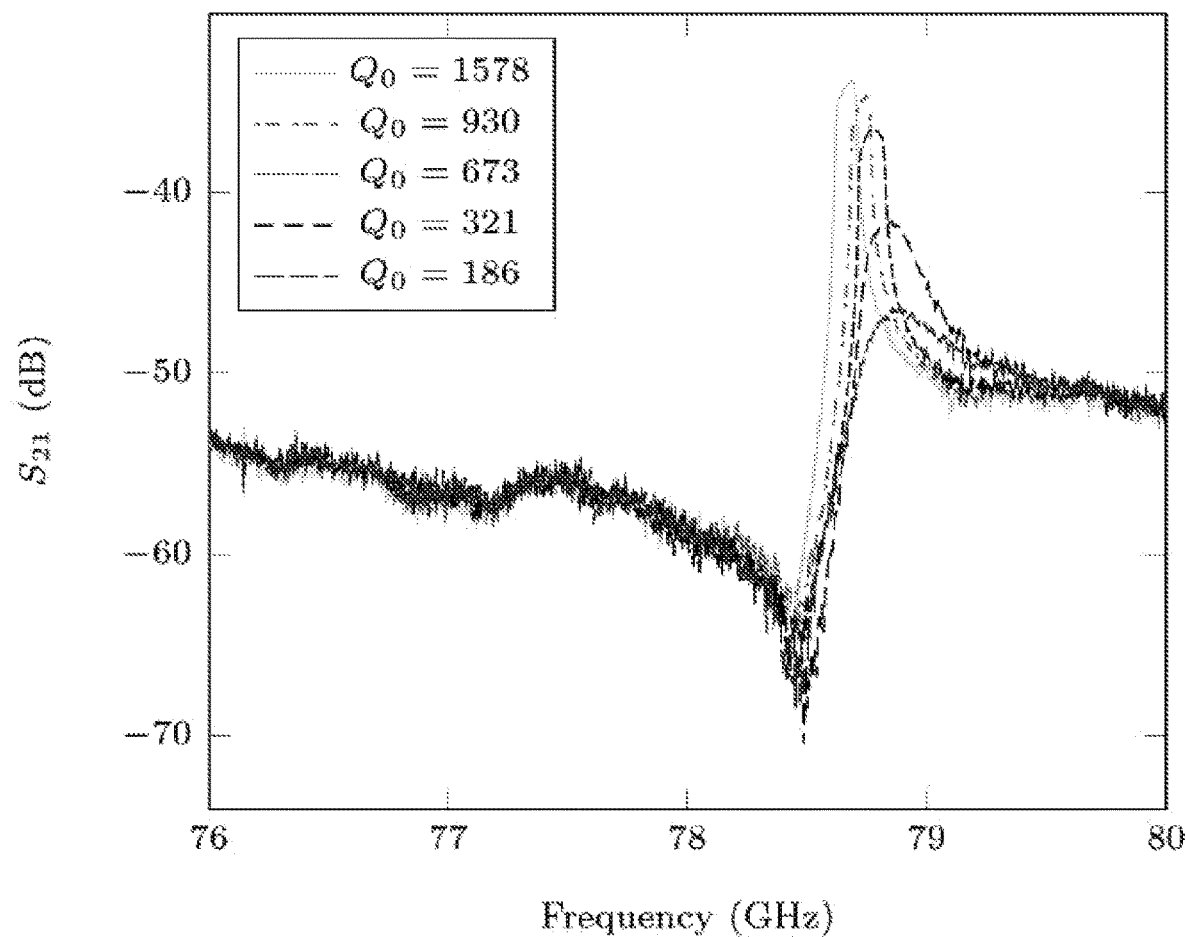
FIG. 13 shows measured frequency responses of the active resonator circuit of FIG. 10.
Figure 14:
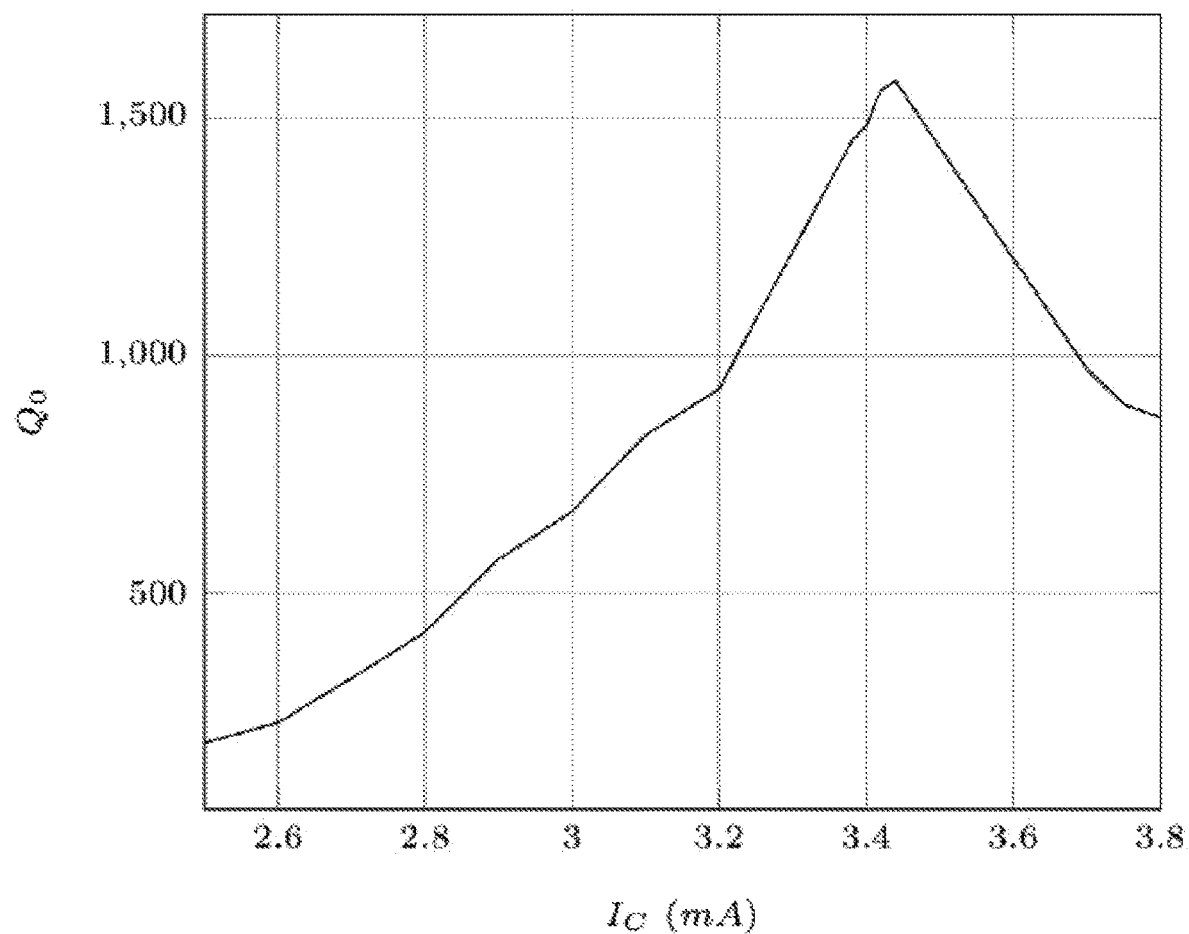
FIG. 14 illustrates a plot of collector current ($I_c$) versus quality factor ($Q_0$) for the active resonator circuit of FIG. 10.

FIG. 12 shows an on-wafer measurement micrograph of the active resonator circuit of FIG. 10 whilst FIG. 13 shows a number of measured frequency responses of the active resonator circuit 40 which illustrates tunability of the quality factor ($Q_0$) of the resonator 42 by controlling the collector current ($I_c$) of the negative-resistance circuit 10. As can be seen in FIG. 13, it has been experimentally demonstrated that the quality factor of the resonator 42 can be enhanced up to 1578 using the negative-resistance circuit 10 made on 130 nm BiCMOS. Therefore, using any one of the negative-resistance circuits 10, 30, a highly selective active bandpass filter can be constructed. FIG. 14 illustrates a plot of collector current ($I_c$) versus quality factor ($Q_0$) for the active resonator circuit 40. Using the negative-resistance circuit 30 with a coupled resonator a tunable filter may be created.

Figure 15:
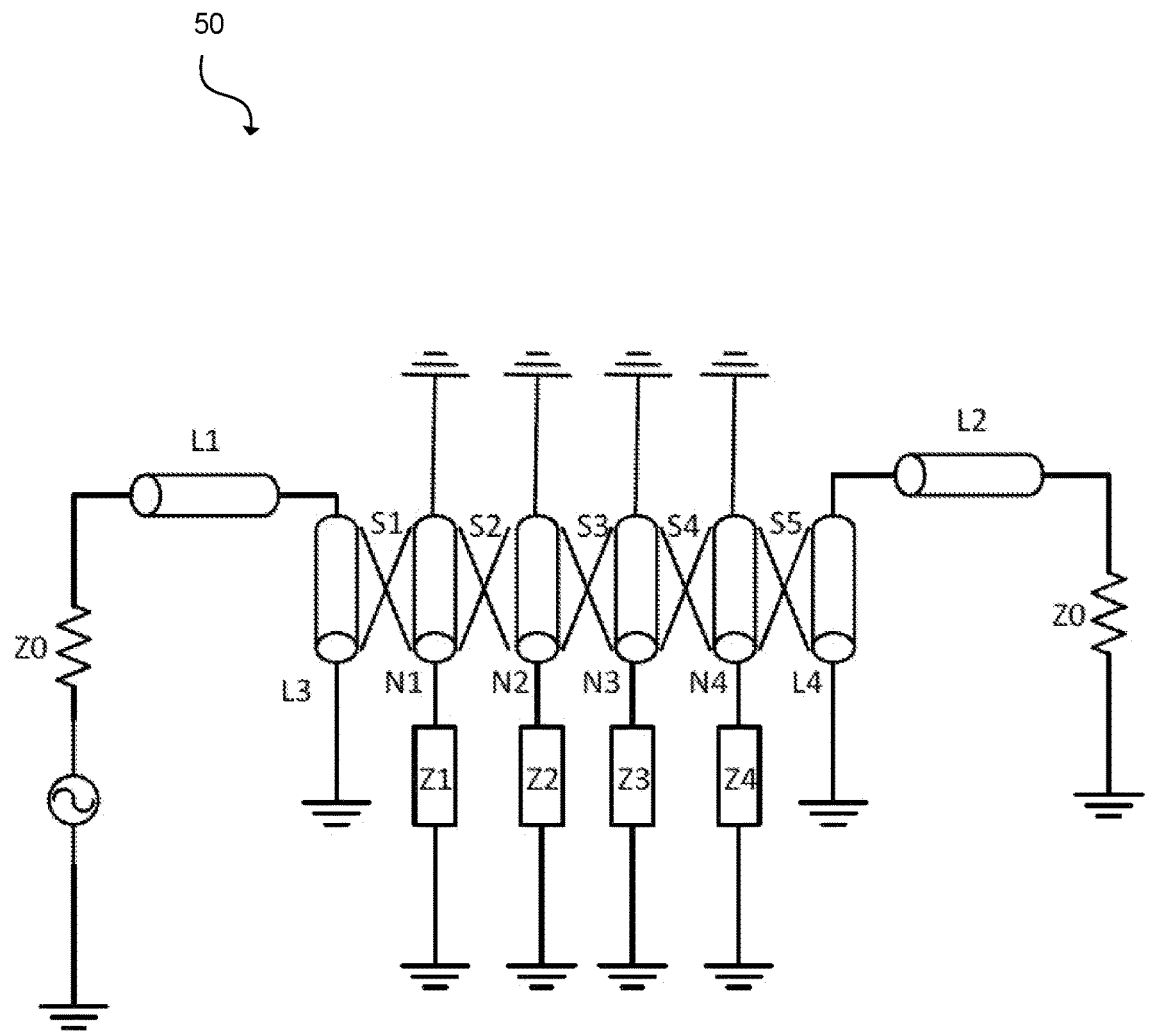
FIG. 15 shows a schematic circuit representation of an active Q-enhanced coupled resonator filter in accordance with another aspect of the invention.

In FIG. 15 reference numeral 50 designates an active Q-enhanced coupled resonator bandpass filter which includes four coupled resonators (N1 to N4) with negative-resistance circuits (Z1 to Z4) connected thereto. The negative-resistance circuits (Z1 to Z4) may take the form of the circuit 10 in FIG. 1 which permits tuning of the quality factor of each resonator or circuit 30 in FIG. 2 which permits tuning of the quality factor as well as the centre frequency of the respective resonators. L1 to L4 designate input and output transmission lines and S1 to S5 designate coupling gaps between the respective resonators and transmission lines. The gaps affect interresonator coupling and $Q_E$. The capacitive loading provided by the negative-resistance circuit, which can be varied by varying the capacitance of the varactor 31 in FIG. 2, can be used to shift the centre frequency ($f_0$) of each resonator and the bias current or collector current ($I_c$) can be used to tune the quality factor $Q_0$ of each resonator.

The Applicant believes that the invention has overcome the drawbacks associated with existing technologies by demonstrating that a fully-tunable on-wafer negative-resistance circuit can be used to overcome high insertion loss associated with silicon-on-chip resonators in the E-band.

The invention claimed is:

1. An active filter which includes:
a plurality of negative-resistance circuits; and
a plurality of coupled resonators, wherein each negative-resistance circuit has an output terminal which is operatively connected in series to a one coupled resonator to form a silicon based microstrip bandpass filter configured for use in the millimetre wave frequency band ranging between 30 GHz and 300 GHz, and wherein each negative-resistance circuit includes:
only one transistor having three terminals;
an inductive element in the form a distributed constant transmission line which is connected to a first terminal of the transistor, the inductive element operatively serving as a Radio Frequency (RF) choke to connect a first power source to the first terminal of the transistor in order to bias the first terminal while suppressing Radio Frequency (RF);
a first capacitive element which operatively bypasses a second power source, connected to a second terminal of the transistor, in order to shunt high frequencies;
a second capacitive element which capacitively couples the output terminal to the first terminal of the transistor; and
a capacitive feedback circuit which is configured to feed a signal from a third terminal of the transistor back to the first terminal.

2. The active filter as claimed in claim 1, wherein the resonators are quarter-wave transmission line resonators.

3. The active filter as claimed in claim 1, wherein the third terminal of the transistor is connected to a ground potential through a resistive element.

4. The active filter as claimed in claim 3, wherein the capacitive feedback circuit includes a third capacitive dement which connects the third terminal to the first terminal.

5. The active filter as claimed in claim 4, which includes a fourth capacitive element, one end of which is connected to the third terminal of the transistor and to the third capacitive element, the other end of which is connected to the ground potential and wherein the fourth capacitive element is in parallel connection with the resistive element.

6. An active filter as claimed in claim 5, in which any one of the second, third or fourth capacitive elements is a variable capacitive element.

7. The active filter as claimed in claim 6, wherein the variable capacitive dement includes a varactor.

8. The active filter as claimed in claim 1, wherein the transistor is a heterojunction bipolar transistor, the first terminal corresponding to the base, the second terminal corresponding to the collector and the third terminal corresponding to the emitter of the transistor.

9. The active filter as claimed in claim 1, wherein the silicon-based microstrip bandpass filter is configured for use in E-band frequencies ranging between 60 GHz and 90 GHz.

10. An on-wafer negative-resistance circuit configured for millimetre wave frequencies ranging between 30 GHz and 300 GHz having an output terminal which is operatively connected or connectable to a transmission line, the negative-resistance circuit including:
only one transistor having three terminals;
an inductive element in the form of a distributed constant transmission line which is connected to a first terminal of the transistor, the inductive element operatively serving as a Radio Frequency (RF) choke to connect a first power source to the first terminal of the transistor in order to bias the first terminal while suppressing Radio Frequency (RF);
a first capacitive element which operatively bypasses a second power source, connected to a second terminal of the transistor, in order to shunt high frequencies;
a second capacitive element which capacitively couples the output terminal to the first terminal of the transistor; and
a capacitive feedback circuit which is configured to feed a signal from a third terminal of the transistor hack to the first terminal.

11. A semiconductor device which includes:
a complementary metal-oxide semiconductor (CMOS) die; and
the negative-resistance circuit as claimed in claim 10 on the die.

12. A semiconductor device which includes:
a complementary metal-oxide semiconductor (CMOS) die; and
the active filter as claimed in claim 9 on the die.

* * * * *

UNITED STATES PATENT AND TRADEMARK OFFICE
CERTIFICATE OF CORRECTION

PATENT NO. : 11,336,263 B2
APPLICATION NO. : 16/771773
DATED : May 17, 2022
INVENTOR(S) : Tinus Stander and Nishant Singh It is certified that error appears in the above-identified patent and that said Letters Patent is hereby corrected as shown below:

In the Claims

Claim 1, Column 9, Line 50, delete "a" before "one coupled resonator".

Claim 4, Column 10, Line 14, delete "dement" and substitute therefor --element--.

Claim 7, Column 10, Line 26, delete "dement" and substitute therefor --element--.

Claim 10, Column 10, Line 55, delete "hack" and substitute therefor --back--.

Claim 12, Column 10, Line 65, delete "9" and substitute therefor --1--.

Signed and Sealed this
Eighth Day of November, 2022

Katherine Kelly Vidal
*Director of the United States Patent and Trademark Office*